United States Patent
Huang

(10) Patent No.: US 12,040,023 B2
(45) Date of Patent: Jul. 16, 2024

(54) WRITING METHOD OF FLASH MEMORY AND MEMORY STORAGE DEVICE

(71) Applicant: Winbond Electronics Corp., Taichung (TW)

(72) Inventor: Koying Huang, San Jose, CA (US)

(73) Assignee: Winbond Electronics Corp., Taichung (TW)

( * ) Notice: Subject to any disclaimer, the term of this patent is extended or adjusted under 35 U.S.C. 154(b) by 0 days.

(21) Appl. No.: 17/563,095

(22) Filed: Dec. 28, 2021

(65) Prior Publication Data

US 2023/0207020 A1    Jun. 29, 2023

(51) Int. Cl.
*G11C 16/14*    (2006.01)
*G11C 16/34*    (2006.01)

(52) U.S. Cl.
CPC .............. *G11C 16/14* (2013.01); *G11C 16/34* (2013.01)

(58) Field of Classification Search
CPC ................................. G11C 16/14; G11C 16/34
USPC ...................................................... 365/185.22
See application file for complete search history.

(56) References Cited

U.S. PATENT DOCUMENTS

| | | | | |
|---|---|---|---|---|
| 2009/0310411 | A1* | 12/2009 | Lee ........................... | G11C 8/12 365/189.11 |
| 2012/0008413 | A1* | 1/2012 | Jeong ................... | G11C 11/5628 365/185.24 |
| 2014/0108705 | A1* | 4/2014 | Gorobets ............ | G11C 11/5628 711/103 |
| 2022/0085038 | A1* | 3/2022 | Chen ................... | H01L 29/7881 |

FOREIGN PATENT DOCUMENTS

| | | |
|---|---|---|
| CN | 105226065 | 5/2018 |
| TW | I482158 | 4/2015 |
| WO | 03083429 | 10/2003 |

* cited by examiner

*Primary Examiner* — Anthan Tran
(74) *Attorney, Agent, or Firm* — JCIPRNET

(57) ABSTRACT

A memory storage device including a flash memory and a controller circuit is provided. The flash memory includes a plurality of memory cells. Each of the memory cells includes a substrate, a drain terminal, a source terminal, and a gate terminal. The controller circuit is coupled to the flash memory. The controller circuit is configured to perform a first erase operation on the memory cells to obtain a first erase threshold voltage distribution, and perform a program operation on the memory cells to obtain a program threshold voltage distribution. The first erase threshold voltage distribution is larger than a first target voltage. The program threshold voltage distribution is smaller than a second target voltage. The first target voltage is larger than the second target voltage. A writing method of a flash memory is also provided.

16 Claims, 7 Drawing Sheets

WRITING METHOD OF FLASH MEMORY AND MEMORY STORAGE DEVICE

BACKGROUND

Technical Field

The invention relates to a writing method of a flash memory and a memory storage device including the flash memory.

Description of Related Art

For NOR flash memories, a controller circuit may write storage data into memory cells by an erase operation and a program operation. The controller circuit erases the memory cells to a bit state, e.g. the "1" state, and then programs some specified memory cells to another bit state, e.g. the "0" state, based on the data to be stored. In the related art, the erase operation may push the memory cells' threshold voltages lower together in one memory block. Some memory cells may have slow erase speeds, and they would cause other memory cells over erase in the same memory block.

To solve this problem, a post-program operation follows the erase operation to recover an over erase leakage current. However, if power-drop happens before the post-program operation is finished, the over erase cells may have a bit line leakage current after power-up next time. Therefore, the over erase cells may cause the bit line leakage current during a read operation or the program operation.

SUMMARY

The invention is directed to a writing method of a flash memory and a memory storage device including the flash memory, capable of solving the above-mentioned problem of the related art.

An embodiment of the invention provides a writing method of a flash memory. The flash memory includes a plurality of memory cells. The writing method includes: performing a first erase operation on the memory cells to obtain a first erase threshold voltage distribution; and performing a program operation on the memory cells to obtain a program threshold voltage distribution. The first erase threshold voltage distribution is larger than a first target voltage. The program threshold voltage distribution is smaller than a second target voltage. The first target voltage is larger than the second target voltage.

In an embodiment of the invention, each of the memory cell includes a substrate, a drain terminal, a source terminal, and a gate terminal. The step of performing the first erase operation on the memory cells to obtain the first erase threshold voltage distribution includes: respectively applying negative voltages to the substrate, the drain terminal, and the source terminal; and applying a positive voltage to the gate terminal. Absolute values of the negative voltages are the same as an absolute value of the positive voltage.

In an embodiment of the invention, the first erase operation is a channel Fowler-Nordheim (FN) tunneling erase.

In an embodiment of the invention, the method further includes: performing a second erase operation on the memory cells to obtain a second erase threshold voltage distribution. The second erase threshold voltage distribution is larger than a third target voltage. The third target voltage is larger than the first target voltage.

In an embodiment of the invention, the step of performing the second erase operation on the memory cells to obtain the second erase threshold voltage distribution includes: respectively applying a first positive voltage and a second positive voltage to the gate terminal and the drain terminal; and respectively applying ground voltages to the substrate and the source terminal. The first positive voltage is larger than the second positive voltage.

In an embodiment of the invention, the second erase operation is a channel hot electron injection (CHEI) erase.

In an embodiment of the invention, the step of performing the program operation on the memory cells to obtain the program threshold voltage distribution includes: applying a negative voltage to the gate terminal; applying a positive voltage to the drain terminal; and respectively applying ground voltages to the substrate and the source terminal. An absolute value of the negative voltage is larger than an absolute value of the positive voltage.

In an embodiment of the invention, the program operation is a channel FN tunneling program.

An embodiment of the invention provides a memory storage device including a flash memory and a controller circuit. The flash memory includes a plurality of memory cells. Each of the memory cells includes a substrate, a drain terminal, a source terminal, and a gate terminal. The controller circuit is coupled to the flash memory. The controller circuit is configured to perform a first erase operation on the memory cells to obtain a first erase threshold voltage distribution, and perform a program operation on the memory cells to obtain a program threshold voltage distribution. The first erase threshold voltage distribution is larger than a first target voltage. The program threshold voltage distribution is smaller than a second target voltage. The first target voltage is larger than the second target voltage.

In an embodiment of the invention, when the controller circuit performs the first erase operation on the memory cells to obtain the first erase threshold voltage distribution, the controller circuit respectively applies negative voltages to the substrate, the drain terminal, and the source terminal, and the controller circuit applies a positive voltage to the gate terminal. Absolute values of the negative voltages are the same as an absolute value of the positive voltage.

In an embodiment of the invention, the controller circuit is further configured to perform a second erase operation on the memory cells to obtain a second erase threshold voltage distribution. The second erase threshold voltage distribution is larger than a third target voltage, and the third target voltage is larger than the first target voltage.

In an embodiment of the invention, when the controller circuit performs the second erase operation on the memory cells to obtain the second erase threshold voltage distribution, the controller circuit respectively applies a first positive voltage and a second positive voltage to the gate terminal and the drain terminal, and the controller circuit respectively applies ground voltages to the substrate and the source terminal. The first positive voltage is larger than the second positive voltage.

In an embodiment of the invention, when the controller circuit performs the program operation on the memory cells to obtain the program threshold voltage distribution, the controller circuit respectively applies a negative voltage and a positive voltage to the gate terminal and the drain terminal, and the controller circuit respectively applies ground voltages to the substrate and the source terminal. An absolute value of the negative voltage is larger than an absolute value of the positive voltage.

To make the aforementioned more comprehensible, several embodiments accompanied with drawings are described in detail as follows.

BRIEF DESCRIPTION OF THE DRAWINGS

The accompanying drawings are included to provide a further understanding of the disclosure, and are incorporated in and constitute a part of this specification. The drawings illustrate exemplary embodiments of the disclosure and, together with the description, serve to explain the principles of the disclosure.

DESCRIPTION OF THE EMBODIMENTS

Figure 1:
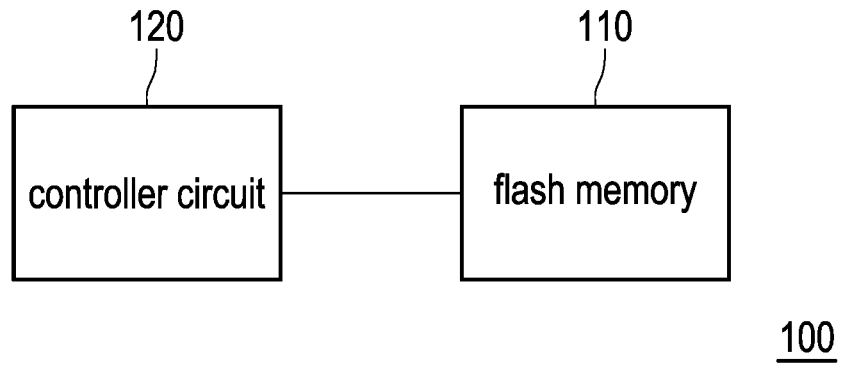
FIG. 1 is a block diagram illustrating a memory storage device according to an embodiment of the invention.
Figure 2:
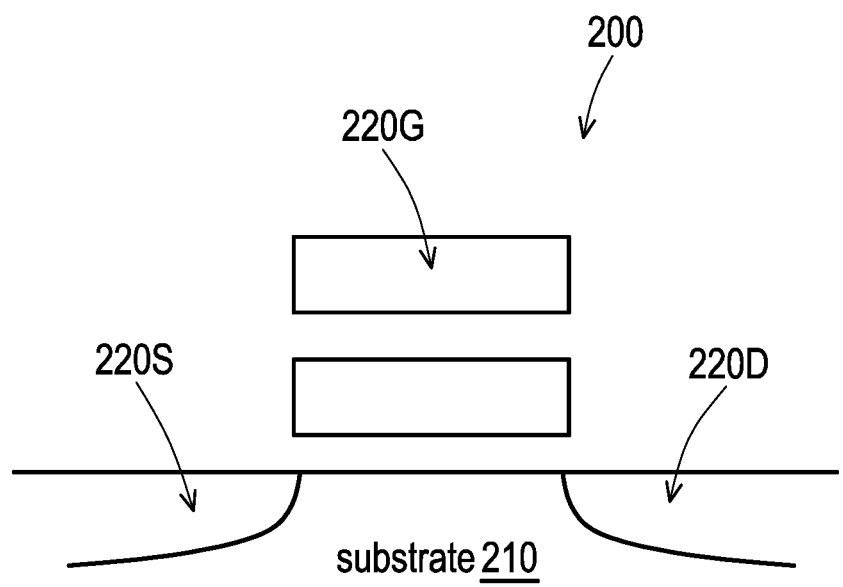
FIG. 2 is a schematic diagram illustrating a structure of a memory cell according to an embodiment of the invention.

FIG. 1 is a block diagram illustrating a memory storage device according to an embodiment of the invention. FIG. 2 is a schematic diagram illustrating a structure of a memory cell according to an embodiment of the invention. Referring to FIG. 1 and FIG. 2, the memory storage device 100 includes a flash memory 110 and a controller circuit 120. The controller circuit 120 is coupled to the flash memory.

The flash memory 110 is a NOR flash memory in the present embodiment. In an embodiment, the controller circuit 120 may be a memory controller, for example. The memory controller may be implemented by Central Processing Unit (CPU), Microprocessor, Digital Signal Processor (DSP), Programmable Controller, Programmable Logic Device (PLD), or other similar devices, or a combination of the said devices, which are not particularly limited by the invention.

The flash memory includes a plurality of memory cells 200. One of the memory cells 200 is illustrated in FIG. 2, for example. Each of the memory cells 200 includes a substrate 210, a drain terminal 220D, a source terminal 220S, and a gate terminal 220G. The controller circuit 120 is configured to perform a first erase operation, a second erase operation and/or a program operation on the memory cells 200 by applying voltages to the terminals of the memory cells 200. In an embodiment, the memory storage device 100 may further include a voltage generating circuit (not illustrated) to generate the voltages that are applied to the terminals of the memory cells 200. The voltages applied to the terminals of the memory cells may be positive voltages, negative voltages and/or ground voltages. The voltage generating circuit may be disposed inside or outside of the controller circuit 120.

Figure 3:
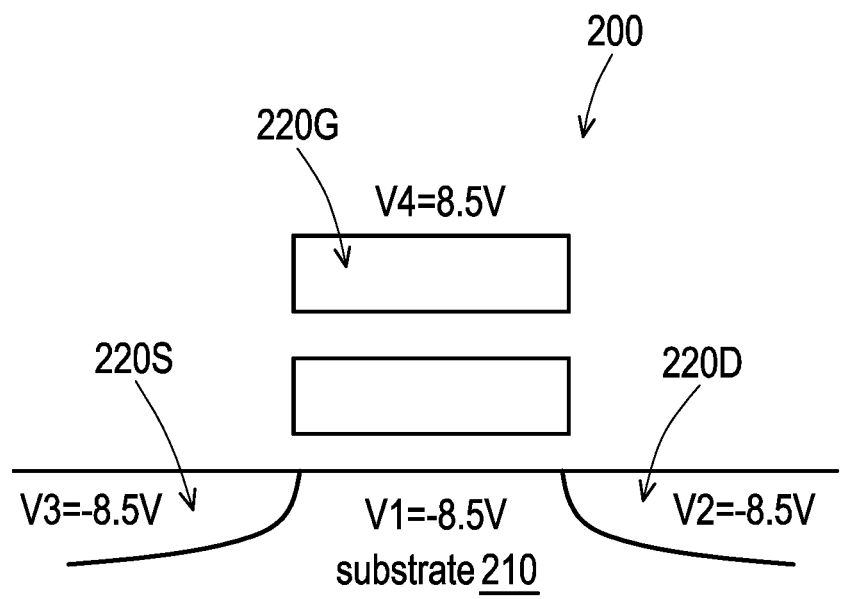
FIG. 3 is a schematic diagram illustrating the first erase operation according to an embodiment of the invention.

FIG. 3 is a schematic diagram illustrating the first erase operation according to an embodiment of the invention. Referring to FIG. 3, when the controller circuit 120 performs the first erase operation on the memory cells 200, the controller circuit 120 respectively applies negative voltages V1, V2 and V3 to the substrate 210, the drain terminal 220D, and the source terminal 220S, and the controller circuit 120 applies a positive voltage V4 to the gate terminal 220G. In the present embodiment, absolute values of the negative voltages V1, V2 and V3 are the same as an absolute value of the positive voltage V4.

For example, the negative voltages V1, V2 and V3 are −8.5 voltages (V), and the positive voltage V4 is 8.5V. Therefore, the absolute values 8.5 of the negative voltages V1, V2 and V3 are the same as the absolute value 8.5 of the positive voltage V4. The values of the voltages applied to the terminals of the memory cells are exemplarily disclosed for example, and do not intend to limit the invention. In the present embodiment, the first erase operation is a channel Fowler-Nordheim (FN) tunneling erase.

Figure 4:
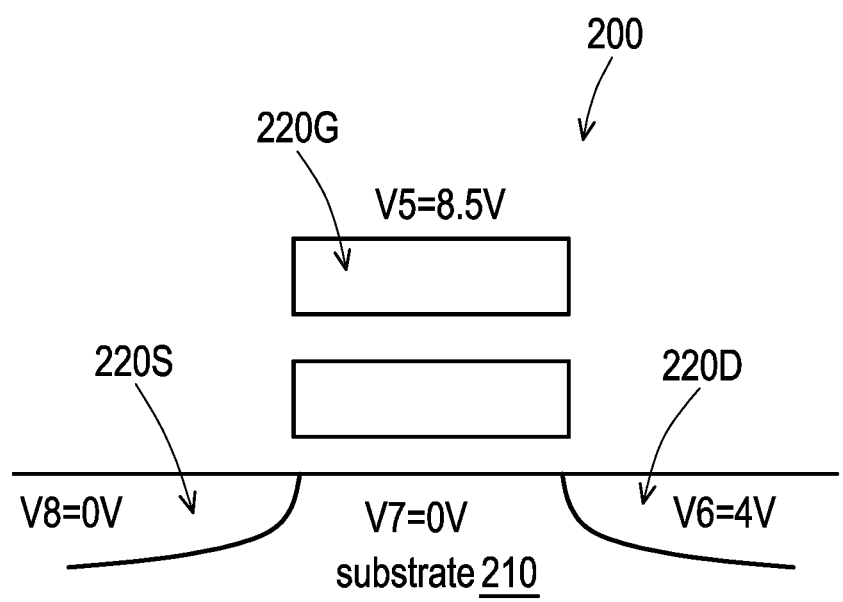
FIG. 4 is a schematic diagram illustrating the second erase operation according to an embodiment of the invention.

FIG. 4 is a schematic diagram illustrating the second erase operation according to an embodiment of the invention. Referring to FIG. 4, when the controller circuit 120 performs the second erase operation on the memory cells 200, the controller circuit 120 respectively applies a first positive voltage V5 and a second positive voltage V6 to the gate terminal 220G and the drain terminal 220D, and the controller circuit 120 respectively applies ground voltages V7 and V8 to the substrate 210 and the source terminal 220S. In the present embodiment, the first positive voltage V5 is larger than the second positive voltage V6.

For example, the first positive voltage V5 are 8.5V, and the second positive voltage V6 is 4V. The ground voltages V7 and V8 are 0V. The values of the voltages applied to the terminals of the memory cells are exemplarily disclosed for example, and do not intend to limit the invention. In the present embodiment, the second erase operation is a channel hot electron injection (CHEI) erase.

Figure 5:
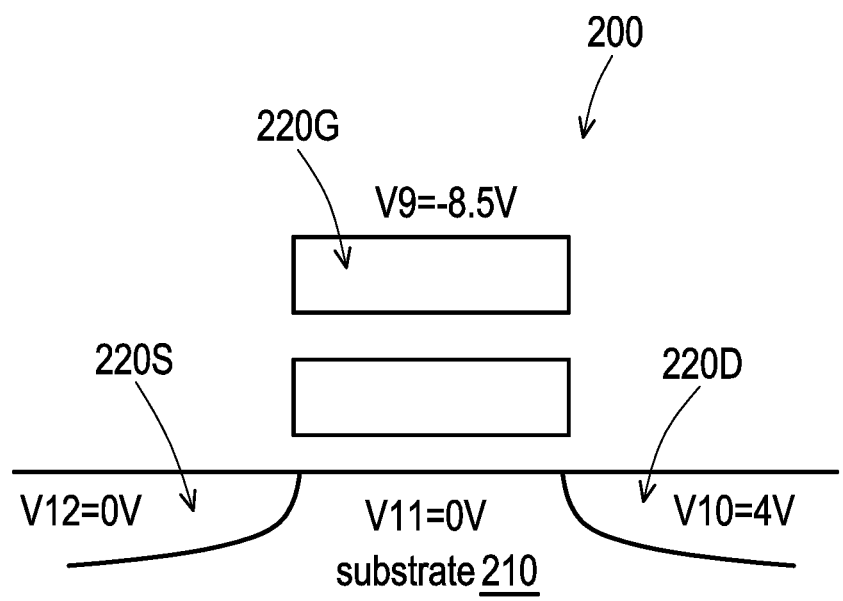
FIG. 5 is a schematic diagram illustrating the program operation according to an embodiment of the invention.

FIG. 5 is a schematic diagram illustrating the program operation according to an embodiment of the invention. Referring to FIG. 5, when the controller circuit 120 performs the program operation on the memory cells 200, the controller circuit 120 respectively applies a negative voltage V9 and a positive voltage V10 to the gate terminal 220G and the drain terminal 220D, and the controller circuit 120 respectively applies ground voltages V11 and V12 to the substrate 210 and the source terminal 220S. In the present embodiment, an absolute value of the negative voltage V9 is larger than an absolute value of the positive voltage V10.

For example, the negative voltage V9 is −8.5V, and the positive voltage V10 is 4V. Therefore, the absolute value 8.5 of the negative voltage V9 is larger than the absolute value 4 of the positive voltage V10. The values of the voltages applied to the terminals of the memory cells are exemplarily disclosed for example, and do not intend to limit the invention. In the present embodiment, the program operation is a channel FN tunneling program.

Figure 6:
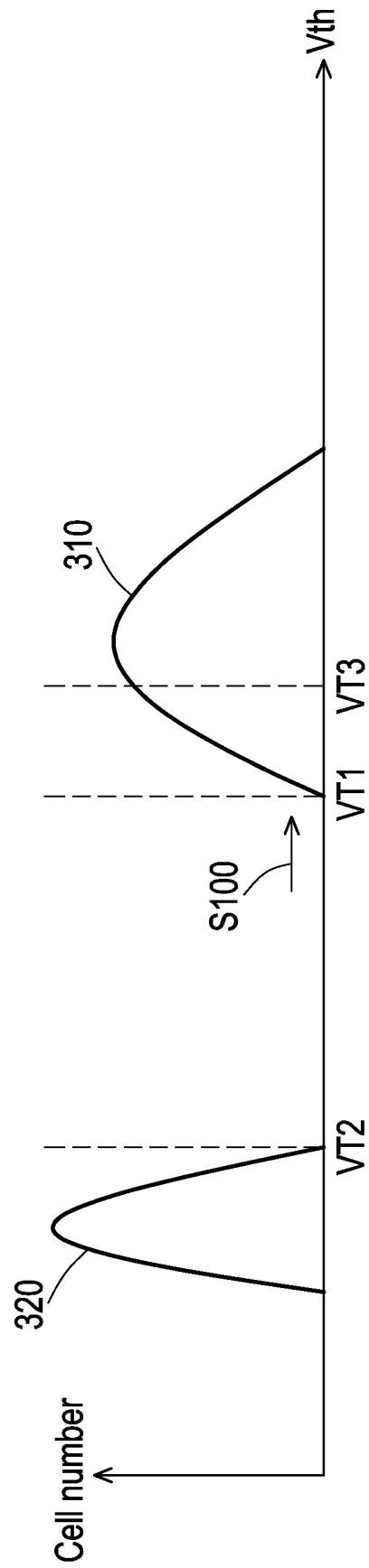
FIG. 6 and FIG. 8 are schematic diagrams illustrating threshold voltage distributions of the memory cells according to different embodiments of the invention.
Figure 7:
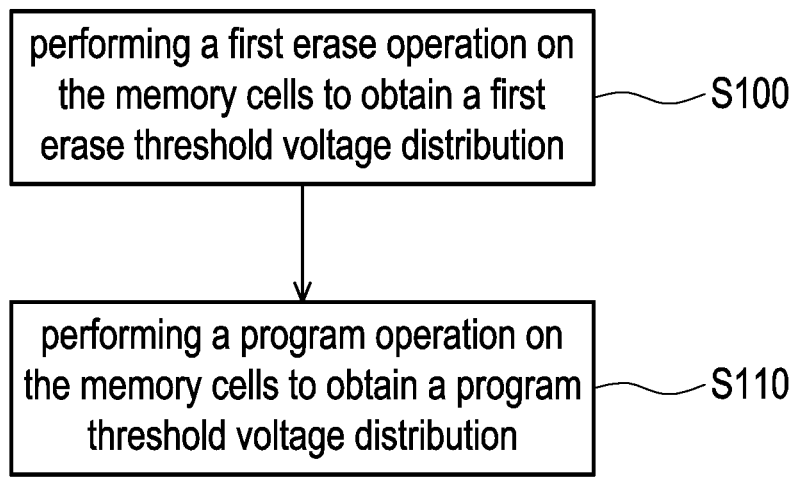
FIG. 7 and FIG. 9 are flowcharts illustrating steps in a writing method of a flash memory according to different embodiments of the invention.

FIG. 6 a schematic diagram illustrating a threshold voltage distribution of the memory cells according to an embodiment of the invention. FIG. 7 is a flowchart illustrating steps in a writing method of a flash memory according to an embodiment of the invention. Referring to FIG. 1, FIG. 6 and FIG. 7, the writing method of the flash memory of the present embodiment is at least adapted to the memory storage device 100 of FIG. 1, but the invention is not limited thereto.

Taking the memory storage device 100 for example, in step S100, the controller circuit 120 performs the first erase operation of FIG. 3 on the memory cells 200 to obtain a first erase threshold voltage distribution 310 during an erase period. The first erase threshold voltage distribution 310 is larger than a first target voltage VT1. In step S110, the controller circuit 120 performs the program operation of FIG. 5 on the memory cells 200 to obtain a program threshold voltage distribution 320 during a program period.

The program threshold voltage distribution 320 is smaller than a second target voltage VT2. In the present embodiment, the first target voltage VT1 is larger than the second target voltage VT2.

Figure 8:
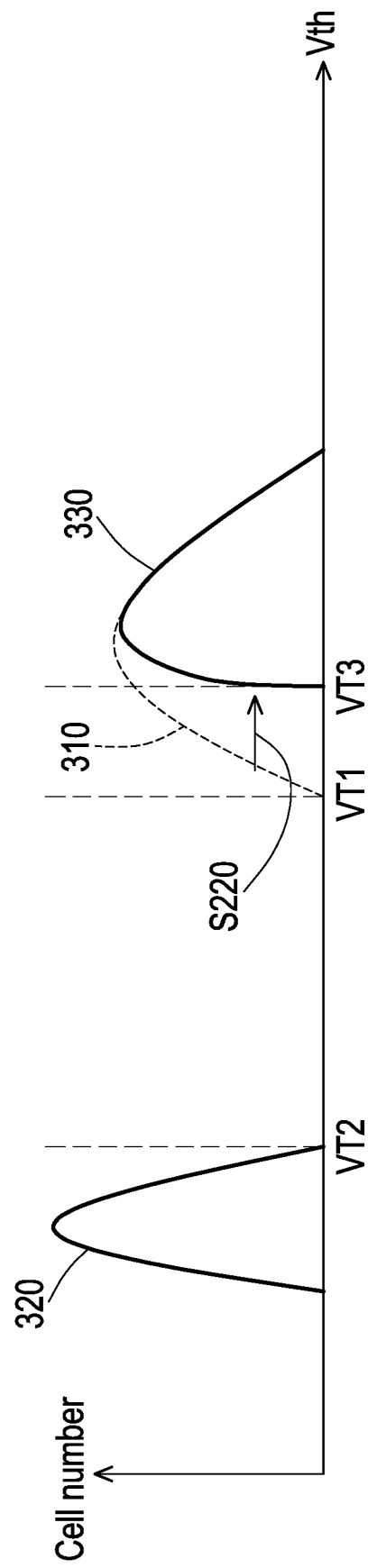
Figure 9:
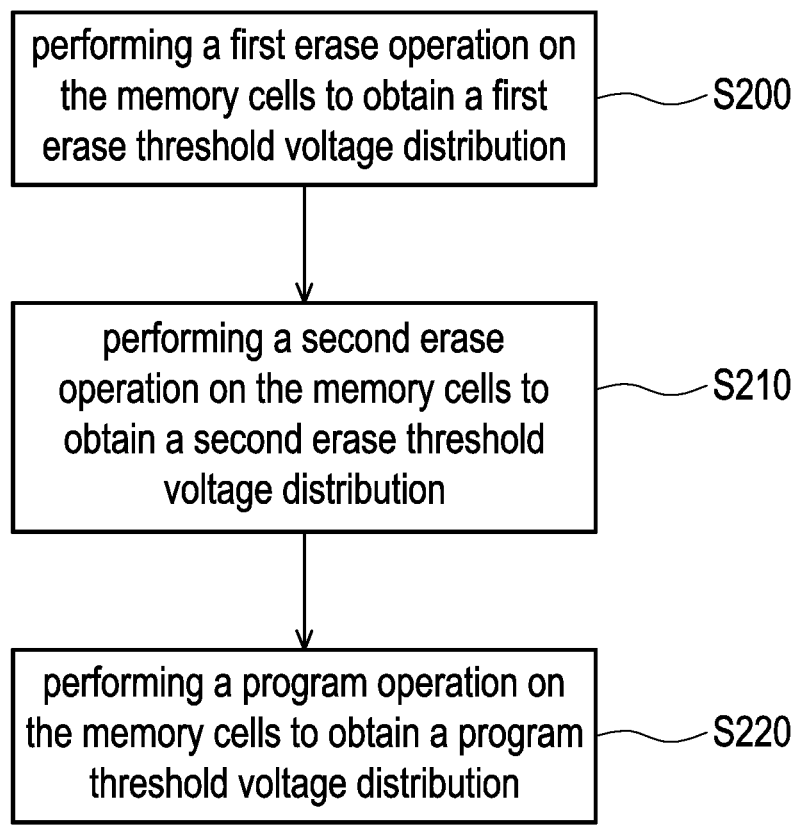

FIG. 8 a schematic diagram illustrating a threshold voltage distribution of the memory cells according to another embodiment of the invention. FIG. 9 is a flowchart illustrating steps in a writing method of a flash memory according to another embodiment of the invention. Referring to FIG. 1, FIG. 8 and FIG. 9, the writing method of the flash memory of the present embodiment is at least adapted to the memory storage device 100 of FIG. 1, but the invention is not limited thereto.

Taking the memory storage device 100 for example, in step S200, the controller circuit 120 performs the first erase operation of FIG. 3 on the memory cells 200 to obtain the first erase threshold voltage distribution 310 during an erase period. The first erase threshold voltage distribution 310 is larger than the first target voltage VT1. In step S210, the controller circuit 120 perform the second erase operation of FIG. 4 on the memory cells 200 to obtain a second erase threshold voltage distribution 330 during the erase period. The second erase threshold voltage distribution 330 is larger than a third target voltage VT3. As shown in FIG. 8, the third target voltage VT3 is larger than the first target voltage VT1. In step S220, the controller circuit 120 performs the program operation of FIG. 5 on the memory cells 200 to obtain the program threshold voltage distribution 320 during the program period.

In the present embodiment, the controller circuit 120 is further configured to perform the second erase operation on the memory cells 200 to push the memory cells' threshold voltages larger than the third target voltage VT3. That is to say, during the erase period, the first erase operation and the second erase operation are performed on the memory cells 200, and the second erase operation can narrow the erase threshold voltage distribution to reduce the memory cells' degradation. The first erase operation is performed with the channel FN tunneling to push the memory cells' threshold voltages larger than the first target voltage VT1. The second erase operation is performed with the CHEI to push the threshold voltages of the memory cells having the slower erase speed further larger than the third target voltage VT3.

In summary, in the embodiments of the invention, since the target voltage of the first erase operation is larger than the target voltage of the program operation, the over erase issue does not happen, and thus there is no bit line leakage current during the read operation or the program operation. In addition, in an embodiment, the second erase operation is performed to further narrow the erase threshold voltage distribution to reduce the memory cells' degradation.

It will be apparent to those skilled in the art that various modifications and variations can be made to the disclosed embodiments without departing from the scope or spirit of the disclosure. In view of the foregoing, it is intended that the disclosure covers modifications and variations provided that they fall within the scope of the following claims and their equivalents.

What is claimed is:

1. A writing method of a flash memory, wherein the flash memory comprises a plurality of memory cells, the writing method comprising:
   performing a first erase operation on the memory cells to obtain a first erase threshold voltage distribution, wherein the first erase threshold voltage distribution is larger than a first target voltage; and
   performing a second erase operation on the memory cells to obtain a second erase threshold voltage distribution after performing the first erasing operation, wherein the second erase threshold voltage distribution is larger than a third target voltage, and the third target voltage is larger than the first target voltage; and
   performing a program operation on the memory cells to obtain a program threshold voltage distribution after performing the first erase operation and the second erase operation on the memory cells, wherein the program threshold voltage distribution is smaller than a second target voltage,
   wherein the first target voltage is larger than the second target voltage.

2. The writing method as claimed in claim 1, wherein each of the memory cell comprises a substrate, a drain terminal, a source terminal, and a gate terminal, and the step of performing the first erase operation on the memory cells to obtain the first erase threshold voltage distribution comprises:
   respectively applying negative voltages to the substrate, the drain terminal, and the source terminal; and
   applying a positive voltage to the gate terminal,
   wherein absolute values of the negative voltages are the same as an absolute value of the positive voltage.

3. The writing method as claimed in claim 2, wherein the first erase operation is a channel Fowler-Nordheim (FN) tunneling erase.

4. The writing method as claimed in claim 1, wherein each of the memory cell comprises a substrate, a drain terminal, a source terminal, and a gate terminal, and the step of performing the second erase operation on the memory cells to obtain the second erase threshold voltage distribution comprises:
   respectively applying a first positive voltage and a second positive voltage to the gate terminal and the drain terminal, wherein the first positive voltage is larger than the second positive voltage; and
   respectively applying ground voltages to the substrate and the source terminal.

5. The writing method as claimed in claim 4, wherein the second erase operation is a channel hot electron injection (CHEI) erase.

6. The writing method as claimed in claim 1, wherein each of the memory cell comprises a substrate, a drain terminal, a source terminal, and a gate terminal, and the step of performing the program operation on the memory cells to obtain the program threshold voltage distribution comprises:
   applying a negative voltage to the gate terminal;
   applying a positive voltage to the drain terminal, wherein an absolute value of the negative voltage is larger than an absolute value of the positive voltage; and
   respectively applying ground voltages to the substrate and the source terminal.

7. The writing method as claimed in claim 6, wherein the program operation is a channel Fowler-Nordheim (FN) tunneling program.

8. The writing method as claimed in claim 1, wherein the second erase operation is performed on the memory cells to convert the first erase threshold voltage distribution to obtain the second erase threshold voltage distribution, and
   the program operation is performed on the memory cells to convert the second erase threshold voltage distribution to obtain the program threshold voltage distribution.

9. A memory storage device, comprising:
- a flash memory, comprising a plurality of memory cells, wherein each of the memory cells comprises a substrate, a drain terminal, a source terminal, and a gate terminal; and
- a controller circuit, coupled to the flash memory and configured to perform a first erase operation on the memory cells to obtain a first erase threshold voltage distribution, perform a second erase operation on the memory cells to obtain a second erase threshold voltage distribution after performing the first erasing operation and perform a program operation on the memory cells to obtain a program threshold voltage distribution after performing the first erase operation and the second erase operation on the memory cells,
- wherein the first erase threshold voltage distribution is larger than a first target voltage, the program threshold voltage distribution is smaller than a second target voltage, the second erase threshold voltage distribution is larger than a third target voltage, the third target voltage is larger than the first target voltage, and the first target voltage is larger than the second target voltage.

10. The memory storage device as claimed in claim 9, wherein when the controller circuit performs the first erase operation on the memory cells to obtain the first erase threshold voltage distribution, the controller circuit respectively applies negative voltages to the substrate, the drain terminal, and the source terminal, and the controller circuit applies a positive voltage to the gate terminal,
- wherein absolute values of the negative voltages are the same as an absolute value of the positive voltage.

11. The memory storage device as claimed in claim 10, wherein the first erase operation is a channel Fowler-Nordheim (FN) tunneling erase.

12. The memory storage device as claimed in claim 9, wherein when the controller circuit performs the second erase operation on the memory cells to obtain the second erase threshold voltage distribution, the controller circuit respectively applies a first positive voltage and a second positive voltage to the gate terminal and the drain terminal, and the controller circuit respectively applies ground voltages to the substrate and the source terminal,
- wherein the first positive voltage is larger than the second positive voltage.

13. The memory storage device as claimed in claim 12, wherein the second erase operation is a channel hot electron injection (CHEI) erase.

14. The memory storage device as claimed in claim 9, wherein when the controller circuit performs the program operation on the memory cells to obtain the program threshold voltage distribution, the controller circuit respectively applies a negative voltage and a positive voltage to the gate terminal and the drain terminal, and the controller circuit respectively applies ground voltages to the substrate and the source terminal,
- wherein an absolute value of the negative voltage is larger than an absolute value of the positive voltage.

15. The memory storage device as claimed in claim 14, wherein the program operation is a channel Fowler-Nordheim (FN) tunneling program.

16. The memory storage device as claimed in claim 9, wherein
- the controller circuit is further configured to perform the second erase operation on the memory cells to convert the first erase threshold voltage distribution to obtain the second erase threshold voltage distribution, and
- the controller circuit is further configured to perform the program operation on the memory cells to convert the second erase threshold voltage distribution to obtain the program threshold voltage distribution.

* * * * *